United States Patent
Kamata et al.

(10) Patent No.: US 12,360,405 B2
(45) Date of Patent: Jul. 15, 2025

(54) OPTICAL SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP); QD LASER, Inc., Kawasaki (JP)

(72) Inventors: Yuki Kamata, Nisshin (JP); Hiroyuki Tarumi, Nisshin (JP); Koichi Oyama, Nisshin (JP); Keizo Takemasa, Kawasaki (JP); Kenichi Nishi, Kawasaki (JP); Yutaka Ohnishi, Kawasaki (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); QD LASER, Inc., Kawasaki (JP)

( * ) Notice: Subject to any disclaimer, the term of this patent is extended or adjusted under 35 U.S.C. 154(b) by 384 days.

(21) Appl. No.: 17/860,229

(22) Filed: Jul. 8, 2022

(65) Prior Publication Data

US 2023/0027143 A1    Jan. 26, 2023

(30) Foreign Application Priority Data

Jul. 13, 2021    (JP) .................................. 2021-115689

(51) Int. Cl.
  *G02F 1/017*    (2006.01)
  *H01S 5/34*    (2006.01)
  *H01S 5/50*    (2006.01)

(52) U.S. Cl.
  CPC ...... *G02F 1/01791* (2021.01); *G02F 1/01708* (2013.01); *H01S 5/341* (2013.01); *H01S 5/3412* (2013.01); *H01S 5/50* (2013.01); *G02F 2203/70* (2013.01)

(58) Field of Classification Search
  CPC .................. H01S 5/341–3412; G02F 1/01791
  See application file for complete search history.

(56) References Cited

U.S. PATENT DOCUMENTS

| | | | |
|---|---|---|---|
| 6,239,449 B1* | 5/2001 | Fafard | H01L 31/09 257/17 |
| 6,294,794 B1* | 9/2001 | Yoshimura | H01L 29/127 257/14 |

(Continued)

FOREIGN PATENT DOCUMENTS

| | | |
|---|---|---|
| CN | 107645123 A | 1/2018 |
| JP | H11-354839 A | 12/1999 |

(Continued)

OTHER PUBLICATIONS

U.S. Appl. No. 17/724,570, filed Apr. 20, 2022, Tarumi et al.

*Primary Examiner* — Joshua King
(74) *Attorney, Agent, or Firm* — Posz Law Group, PLC

(57) ABSTRACT

An optical semiconductor device includes an active layer having a plurality of quantum dot layers. The plurality of quantum dot layers include: a first quantum dot layer doped with a p-type impurity; and a second quantum dot layer doped with an n-type impurity and having an emission wavelength different from that of the first quantum dot layer.

17 Claims, 6 Drawing Sheets

(56) References Cited

U.S. PATENT DOCUMENTS

| | | | |
|---|---|---|---|
| 6,445,000 B1* | 9/2002 | Masalkar | H01L 31/0352 257/440 |
| 6,753,273 B2* | 6/2004 | Holonyak, Jr. | B82Y 10/00 438/45 |
| 7,217,959 B2* | 5/2007 | Chen | H01R 12/51 257/79 |
| 7,279,716 B2* | 10/2007 | Chen | G02F 1/133603 313/506 |
| 8,106,378 B2* | 1/2012 | Saito | H01S 5/341 257/14 |
| 8,368,046 B2* | 2/2013 | Yokoyama | H01L 29/127 257/14 |
| 2003/0170927 A1 | 9/2003 | Holonyak, Jr. | B82Y 20/00 257/E29.071 |
| 2004/0131097 A1* | 7/2004 | Deppe | B82Y 20/00 372/45.01 |
| 2005/0045868 A1* | 3/2005 | Otsubo | H01S 5/2231 257/14 |
| 2005/0051766 A1* | 3/2005 | Stokes | H01S 5/341 257/17 |
| 2005/0092980 A1* | 5/2005 | Chen | H01L 33/06 257/14 |
| 2005/0169332 A1* | 8/2005 | Schwarz | H01S 5/341 372/39 |
| 2006/0222028 A1* | 10/2006 | Hatori | H01S 5/341 977/774 |
| 2007/0108888 A1* | 5/2007 | Chen | C09K 11/0883 313/503 |
| 2007/0201522 A1* | 8/2007 | Huffaker | B82Y 20/00 372/39 |
| 2008/0157102 A1* | 7/2008 | Hori | H01L 21/02516 257/88 |
| 2008/0165819 A1* | 7/2008 | Lin | B82Y 20/00 372/44.01 |
| 2008/0237628 A1* | 10/2008 | Satoh | H01L 33/18 438/22 |
| 2008/0308788 A1 | 12/2008 | Ebe et al. | |
| 2008/0310470 A1* | 12/2008 | Ooi | H01S 5/341 438/46 |
| 2009/0206323 A1* | 8/2009 | Yokoyama | B82Y 10/00 438/45 |
| 2009/0236584 A1* | 9/2009 | Makihara | H01L 33/08 438/47 |
| 2010/0176370 A1* | 7/2010 | Yokoyama | H01L 33/26 438/22 |
| 2011/0181945 A1* | 7/2011 | Nishi | H01S 5/341 977/932 |
| 2012/0007043 A1* | 1/2012 | Yokoyama | H01L 33/06 257/9 |
| 2014/0007930 A1* | 1/2014 | Kim | H01L 31/022425 438/94 |
| 2016/0087153 A1* | 3/2016 | Terashima | H01L 33/12 372/49.01 |
| 2016/0218252 A1* | 7/2016 | Steckel | H01L 33/501 |
| 2023/0027143 A1* | 1/2023 | Kamata | G02F 1/01791 |

FOREIGN PATENT DOCUMENTS

| | | | | |
|---|---|---|---|---|
| JP | 2011-003803 A | 1/2011 | | |
| JP | 2012-049399 A | 3/2012 | | |
| JP | 2014-045015 A | 3/2014 | | |
| JP | 2016-163030 A | 9/2016 | | |
| WO | WO-2007144471 A1 * | 12/2007 | | H01S 5/0609 |
| WO | WO-2009118790 A1 * | 10/2009 | | H01L 33/06 |
| WO | WO-2022137475 A1 * | 6/2022 | | H10K 50/115 |

\* cited by examiner

OPTICAL SEMICONDUCTOR DEVICE

CROSS REFERENCE TO RELATED APPLICATION

The present application claims the benefit of priority from Japanese Patent Application No. 2021-115689 filed on Jul. 13, 2021. The entire disclosures of the above application are incorporated herein by reference.

TECHNICAL FIELD

The present disclosure relates to an optical semiconductor device including a quantum dot layer.

BACKGROUND

In a semiconductor laser device using an optical semiconductor device such as a semiconductor optical amplifier (SOA), it has been proposed to three-dimensionally contain an electron with a quantum dot layer and to add a p-type impurity in a vicinity of an active layer so as to achieve a high output in a wide temperature range while suppressing a decrease in output at a high temperature.

In an optical semiconductor device using a quantum dot layer, the output is less likely to decrease at a high temperature than that in a device using a quantum well, but a wavelength band is narrow. Thus, it has been also proposed to combine a plurality of quantum dot layers having different emission wavelengths so as to achieve a large output in a wide wavelength band.

SUMMARY

The present disclosure describes an optical semiconductor device which is capable of improving a gain. The optical semiconductor device may include an active layer having a plurality of quantum dot layers. The plurality of quantum dot layers include a first quantum dot layer doped with a p-type impurity, and a second quantum dot layer doped with an n-type impurity and having an emission wavelength different from that of the first quantum dot layer.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
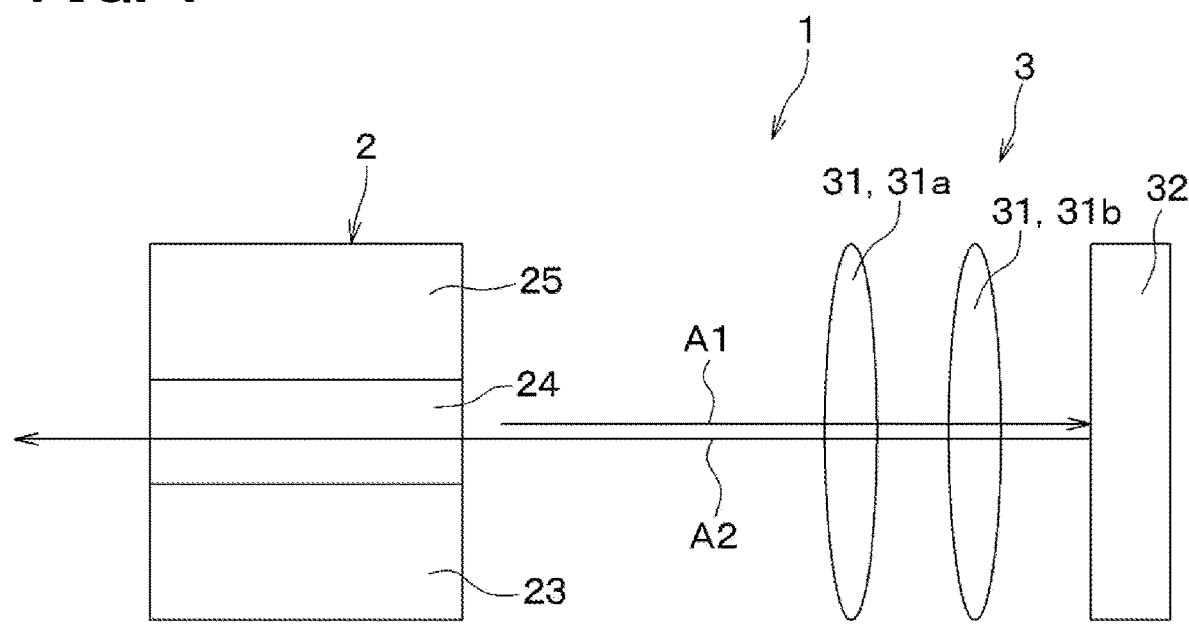
FIG. 1 is a diagram showing a schematic configuration of a semiconductor laser device according to a first embodiment.

To begin with, a relevant technology will be described only for understanding the embodiments of the present disclosure.

As a relevant technology, for example, it has been proposed to combine a plurality of quantum dot layers having different emission wavelengths so as to achieve a large output in a wide wavelength band.

In a quantum dot layer doped with a p-type impurity, the gain is likely to decrease at a low temperature. Therefore, if only the quantum dot layer doped with a p-type impurity is used, the output may be insufficient at a low temperature.

On the other hand, it is conceivable to use a quantum dot layer that is not doped with a p-type impurity. In such a quantum dot layer, the decrease in gain at a low temperature is smaller than that of the quantum dot layer doped with the p-type impurity, but the decrease in gain at a high temperature is larger than that of the quantum dot layer doped with the p-type impurity. Therefore, if only the quantum dot layer that is not doped with the p-type impurity is used, the output may be insufficient at a high temperature.

The inventors of the present disclosure have proposed an optical semiconductor device including a quantum dot layer doped with a p-type impurity and an undoped quantum dot layer containing almost no p-type impurity. In such an optical semiconductor element, it is possible to expand the emission band and suppress fluctuations of the gain due to the temperature change when an operating wavelength is fixed.

However, the inventors of the present disclosure have found that, in such an optical semiconductor device, carrier diffusion is likely to be insufficient due to the undoped layer, and there may be a quantum dot layer that does not contribute to light emission. Therefore, there is room to increase the quantum dot layer that contributes to the light emission, thereby improve the gain of the optical semiconductor device.

The present disclosure provides an optical semiconductor device capable of improving the gain.

According to an aspect of the present disclosure, an optical semiconductor device includes an active layer having a plurality of quantum dot layers. The plurality of quantum dot layers includes a first quantum dot layer doped with a p-type impurity, and a second quantum dot layer doped with an n-type impurity and having an emission wavelength different from that of the first quantum dot layer.

In such a configuration, since the diffusion of holes is promoted by the second quantum dot layer doped with the n-type impurity, it is possible to increase the quantum dot layers that contribute to light emission, thereby to improve the gain.

Hereinafter, embodiments of the present disclosure will be described with reference to the drawings. In the following descriptions of the embodiments, the same or equivalent parts are designated with the same reference numerals.

First Embodiment

A first embodiment will be described. As shown in FIG. 1, a semiconductor laser device 1 of the present embodiment includes a semiconductor optical amplifier (SOA) 2 as an optical semiconductor device, and a wavelength selector 3. The semiconductor laser device 1 is applied to, for example, a laser radar, LiDAR, or the like. LiDAR is an abbreviation for Light Detection And Ranging. The SOA 2 and the wavelength selector 3 are formed, for example, by processing a semiconductor substrate (not shown) through a semiconductor process.

Figure 2:
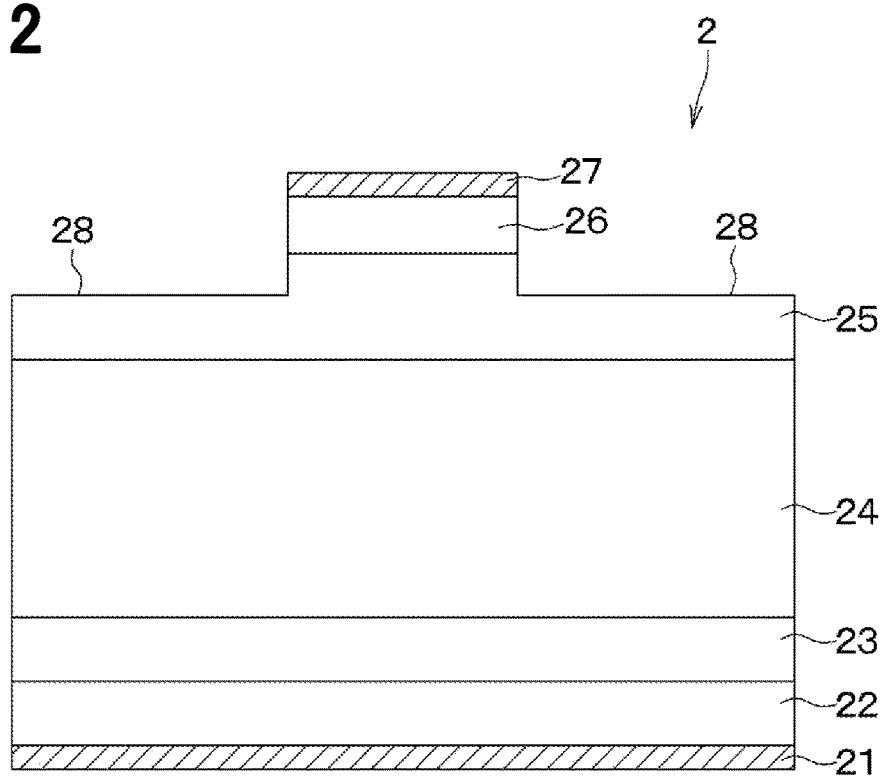
FIG. 2 is a cross-sectional view of a SOA of the semiconductor laser device shown in FIG. 1.

The SOA 2 is a light source that generates a laser light. As shown in FIG. 2, the SOA 2 includes a stacked structure of a lower electrode 21, a substrate 22, an underclad layer 23, an active layer 24, an overclad layer 25, a contact layer 26, and an upper electrode 27. Note that, in FIG. 1, the SOA 2 is shown with only the underclad layer 23, the active layer 24, and the overclad layer 25.

As shown in FIG. 2, the lower electrode 21 is in contact with a back surface of the substrate 22, which is opposite to the underclad layer 23. The substrate 22 is made of, for example, a GaAs substrate. The underclad layer 23 is an n-type clad layer made of n-type AlGaAs or the like. The active layer 24 is formed on an upper surface of the underclad layer 23. Details of the active layer 24 will be described later.

The overclad layer 25 is formed on an upper surface of the active layer 24. The overclad layer 25 is a p-type clad layer made of p-type AlGaAs or the like. The contact layer 26 is provided for having contact with the upper electrode 27, and is formed on an upper surface of the overclad layer 25. The contact layer 26 is made of, for example, GaAs.

The upper electrode 27 is formed on an upper surface of the contact layer 26. A recess 28 is formed to penetrate the upper electrode 27 and the contact layer 26, and to reach a surface layer portion of the overclad layer 25. Thus, the SOA 2 has a mesa structure in which the upper electrode 27 and the contact layer 26 protrude at a position other than the recess 28.

In the SOA2 configured as described above, when a voltage is applied to cause a predetermined potential difference between the upper electrode 27 and the lower electrode 21, laser oscillation is generated and laser light is emitted from the end face of the active layer 24.

Figure 3:
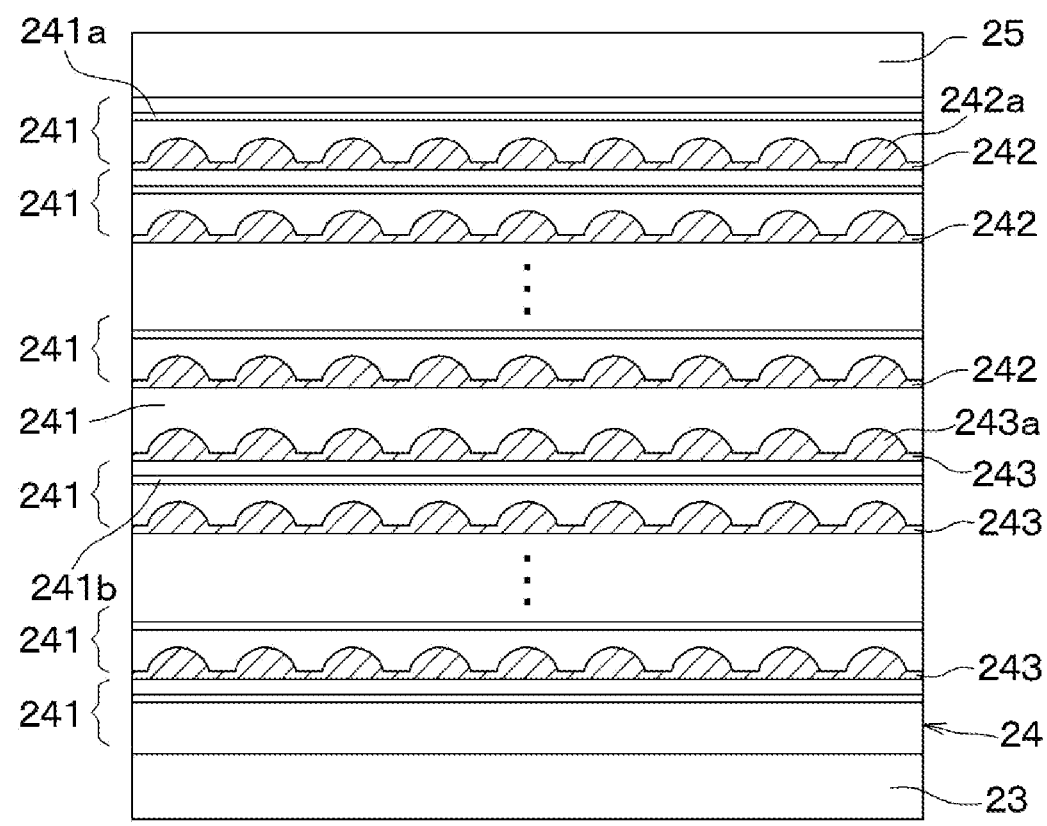
FIG. 3 is a cross-sectional view of an active layer of the SOA shown in FIG. 2.

The detailed configuration of the active layer 24 will be described. As shown in FIG. 3, the active layer 24 includes intermediate layers 241. The intermediate layer 241 is made of GaAs. Further, the active layer 24 includes a plurality of quantum dot layers. The quantum dot layers are made of, for example, InAs or InGaAs. The quantum dot layer has a structure including granular quantum dots formed by crystal growth, microfabrication, or the like, and the front surface and the back surface of the quantum dot layer are covered with the intermediate layers 241.

A gain spectrum of the active layer 24 has a maximum value composed of light emission by the basis level of the plurality of quantum dot layers. The emission wavelength and the gain intensity of the active layer 24 are determined by the composition of the plurality of quantum dot layers. The gain spectrum can be measured, for example, by the Hakki-Paoli method.

The plurality of quantum dot layers include a quantum dot layer 242 and a quantum dot layer 243. The quantum dot layer 242 is doped with a p-type impurity at a high concentration, and the quantum dot layer 243 is doped with an n-type impurity at a high concentration. The quantum dot layer 242 corresponds to a first quantum dot layer, and the quantum dot layer 243 corresponds to a second quantum dot layer.

The active layer 24 includes a plurality of quantum dot layers 242 and a plurality of quantum dot layers 243. The plurality of quantum dot layers 242 are stacked on top of the plurality of quantum dot layers 243. That is, the quantum dot layers 242 are located closer to the overclad layer 25, which is disposed above the active layer 24, than the quantum dot layers 243. For example, the active layer 24 includes eight quantum dot layers 242, and eight quantum dot layers 243.

As described above, the intermediate layers 241 are stacked on both sides of each of the quantum dot layers 242 and 243. The intermediate layer 241 disposed between the two quantum dot layers 242 and the intermediate layer 241 disposed on the uppermost quantum dot layer 242 each include a p-type impurity layer 241a. The intermediate layer 241 disposed between the two quantum dot layers 243 and the intermediate layer 241 disposed under the lowermost quantum dot layer 243 each include an n-type impurity layer 241b.

The p-type impurity layer 241a is a layer formed by adding a p-type impurity during the formation of the intermediate layer 241 and is configured to contain a small amount of p-type impurity in GaAs. The n-type impurity layer 241b is a layer formed by adding an n-type impurity during the formation of the intermediate layer 241 and is configured to contain a small amount of n-type impurity in GaAs.

By arranging the p-type impurity layers 241a in the vicinity of the quantum dot layers 242, in this way, the p-type impurity diffused from the p-type impurity layers 241a is added to the quantum dot layers 242. Likewise, by arranging the n-type impurity layers 241b in the vicinity of the quantum dot layers 243, in this way, the n-type impurity diffused from the n-type impurity layer 241b is added to the quantum dot layer 243. The intermediate layer 241 between the quantum dot layer 242 and the quantum dot layer 243 may contain either of the p-type impurity layer 241a or the n-type impurity layer 241b. Alternatively, the intermediate layer 241 between the quantum dot layer 242 and the quantum dot layer 243 may contain neither the p-type impurity layer 241a nor the n-type impurity layer 241b.

The p-type impurity concentration of the p-type impurity layers 241a increases as the p-type impurity layers 241a are closer to the overclad layer 25. The n-type impurity concentration of the n-type impurity layers 241b increases as the n-type impurity layers 241b are closer to the underclad layer 23. With such a configuration, the p-type impurity concentration of the quantum dot layers 242 increases as the quantum dot layers 242 are closer to the overclad layer 25, and the n-type impurity concentration of the quantum dot layers 243 increases as the quantum dot layers 243 are closer to the underclad layer 23.

The impurity concentration is set based on, for example, the number of holes contained in one quantum dot. Specifically, two or more holes are contained in one quantum dot. The p-type impurity concentration of the quantum dot layer 242 is at least twice the surface density of the quantum dots 242a formed in the quantum dot layer 242. The n-type impurity concentration of the quantum dot layer 243 is at least twice the surface density of the quantum dots 243a formed in the quantum dot layer 243.

In the present embodiment in which the p-type impurity concentration of the quantum dot layers 242 is higher as the quantum dot layers 242 are closer to the overclad layer 25, for example, the p-type impurity concentration of the quantum dot layer 242 closest to the overclad layer 25 is at least twice the surface density of the quantum dots 242a. Further, in the present embodiment in which the n-type impurity concentration of the quantum dot layers 243 is higher as the quantum dot layers 243 are closer to the underclad layer 23, for example, the n-type impurity concentration of the quantum dot layer 243 closest to the underclad layer 23 is at least twice the surface density of the quantum dots 243a.

The quantum dot layer 242 and the quantum dot layer 243 have different emission wavelengths from each other. Specifically, the emission wavelength of the quantum dot layer 242 is shorter than the emission wavelength of the quantum dot layer 243. Assuming that the emission wavelength of the quantum dot layer 242, that is, the wavelength at which the gain of the quantum dot layer 242 peaks is referred to as $\lambda 1$, and the emission wavelength of the quantum dot layer 243 is referred to as $\lambda 2$, for example, the wavelength $\lambda 1$ is 1210 nm and the wavelength $\lambda 2$ is 1280 nm.

Figure 4:
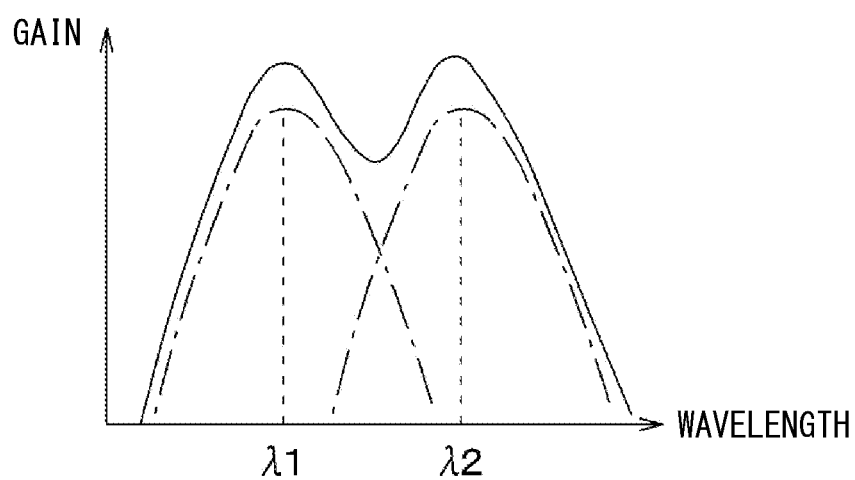
FIG. 4 is a diagram showing a gain spectrum of the active layer.

With such a configuration, the active layer 24 has a gain spectrum as shown in FIG. 4. In FIG. 4, a solid line shows the gain spectrum of the active layer 24. In FIG. 4, an alternate long and short dash line on the left side shows the gain spectrum of the quantum dot layer 242, and an alternate long and short dash line on the right side shows the gain spectrum of the quantum dot layer 243. By combining the two gain spectra, a wide band spectrum having a large gain at wavelengths between the wavelength $\lambda 1$ and the wavelength $\lambda 2$ is formed.

The wavelength selector 3 is a device to select an operating wavelength of the semiconductor laser device 1, specifically, the operating wavelength of the active layer 24. As shown in FIG. 1, the wavelength selector 3 includes an etalon filter 31 and a mirror 32. The operating wavelength of the active layer 24 is referred to as $\lambda$op.

The etalon filter 31 transmits only a predetermined wavelength. The etalon filter 31 is arranged so that the light emitted from the active layer 24 is incident on the etalon filter 31. As shown by an arrow A1 in FIG. 1, the light transmitted through the etalon filter 31 is incident on the mirror 32.

The mirror 32 is arranged so as to reflect the light transmitted from the etalon filter 31 toward the etalon filter 31. As shown by an arrow A2 in FIG. 1, the light reflected by the mirror 32 passes through the etalon filter 31 and enters the active layer 24, and is emitted from the end face of the active layer 24 opposite to the etalon filter 31 and the mirror 32. The wavelength of the light transmitting through the etalon filter 31 can be adjusted by the design of the etalon filter 31. Thus, the operating wavelength of the semiconductor laser device 1 can be selected by adjusting the wavelength of the transmitting light.

In the present embodiment, the wavelength selector 3 selects the operating wavelength $\lambda$op so that the active layer 24 oscillates in a single mode, that is, oscillates at a single wavelength. Specifically, the wavelength selector 3 includes two etalon filters 31. The two etalon filters 31 are etalon filters 31a and 31b.

The etalon filters 31a and 31b have different free spectrum intervals, and a plurality of wavelengths transmitted by the etalon filter 31a and a plurality of wavelengths transmitted by the etalon filter 31b overlap at only one wavelength. Therefore, as shown in FIG. 1, by placing the etalon filters 31a and 31b on the path of the light emitted from the active layer 24, the light of this one wavelength is incident on the mirror 32 and returns to the active layer 24. As a result, the active layer 24 oscillates in the single mode.

The operating wavelength $\lambda$op may be selected so that the active layer 24 oscillates in a multimode. However, the gain fluctuation can be reduced by oscillating the active layer 24 in the single mode.

In the example described above, the wavelength selector 3 includes the etalon filter 31 and the mirror 32. As another example, the wavelength selector 3 may include a diffraction grating or the like that reflects only light of a predetermined wavelength. When the wavelength selector 3 includes the diffraction grating, the active layer 24 oscillates in a single mode. Alternatively, the operating wavelength of the semiconductor laser device 1 may be selected by applying a voltage or the like from the outside to the wavelength selector 3 including the etalon filter, the diffraction grating or the like. The reflectance of the mirror 32 may be adjusted so as to emit the light from the mirror 32 side.

The operating wavelength $\lambda$op is a wavelength between the wavelength $\lambda 1$ at a predetermined temperature and the wavelength $\lambda 2$ at the predetermined temperature. The predetermined temperature is a room temperature or a temperature at the center of assumed environmental temperatures. The room temperature is a temperature of 20 degrees Celsius (° C.) or higher and 28° C. or lower. The room temperature is, for example, 25° C. The assumed environmental temperatures are, for example, −40° C. or higher and 85° C. or lower.

The temperature characteristics of the gain of the quantum dot layer will be described. The wavelength of the gain spectrum of the quantum dot layer shifts due to the temperature change. Specifically, when the temperature rises, the gain spectrum shifts to a long wavelength side, and when the temperature drops, the gain spectrum shifts to a short wavelength side. Therefore, if the operating wavelength is fixed, the output of the quantum dot layer decreases due to the temperature change.

Figure 5:
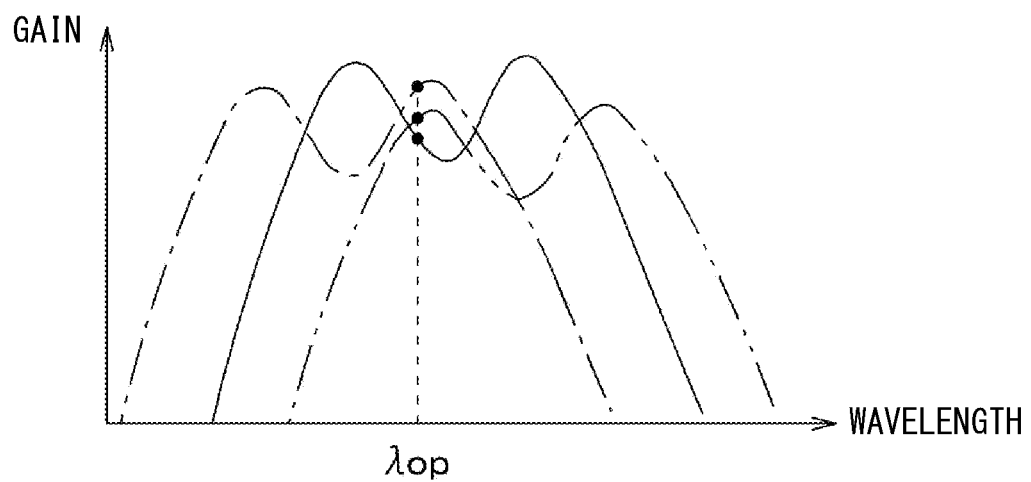
FIG. 5 is a diagram showing temperature characteristics of a gain.

On the other hand, by using a plurality of quantum dot layers having different emission wavelengths in combination, the gain spectrum can be widened and the decrease in gain due to the wavelength shift can be suppressed. That is, as shown in FIG. 5, when the temperature is low, the gain of the entire active layer 24 is kept by the gain of the quantum dot layers 243. When the temperature is high, the gain of the entire active layer 24 is kept by the gain of the quantum dot layers 242. In FIG. 5, a solid line indicates the gain of the active layer 24 at the room temperature. An alternate long and single short dash line on a left side indicates the gain of the active layer 24 at a low temperature, and an alternate long and double short dash line on a right side indicates the gain of the active layer 24 at a high temperature.

When the n-type impurity is added, the gain at the high temperature decreases. However, if the quantum dot layer 243 doped with the n-type impurity is on the long wavelength side, the gain of the quantum dot layer 243 affects only when the temperature is low. Therefore, it is possible to suppress a decrease in gain at the operating wavelength $\lambda$op, when the temperature is high. The quantum dot layer doped with the p-type impurity has a smaller gain decrease when the temperature is high, as compared with the quantum dot layer doped with the n-type impurity. Therefore, it is possible to suppress a decrease in gain at the operating wavelength $\lambda$op when the temperature is high, by setting the wavelength of the quantum dot layers 242 on the short wavelength side.

Figure 6:
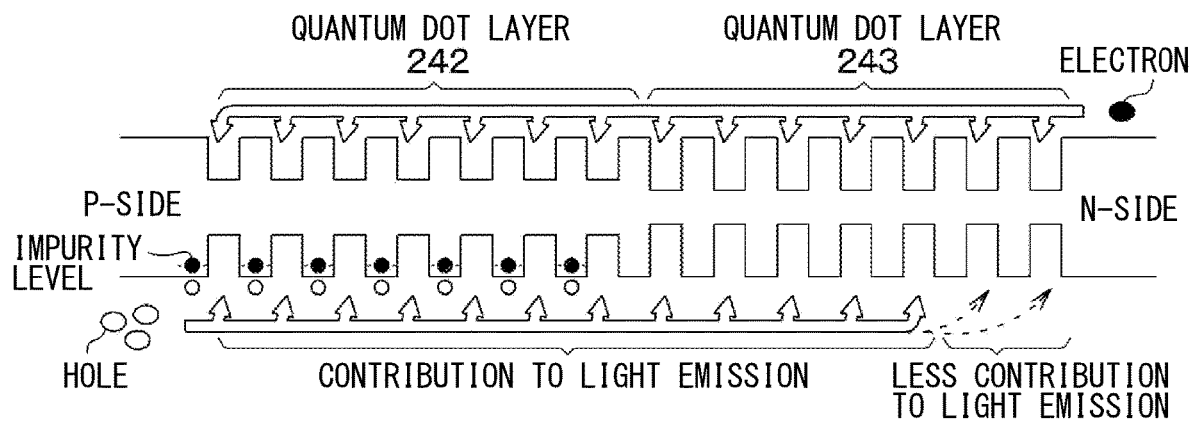
FIG. 6 is a band diagram of a comparative example.
Figure 7:
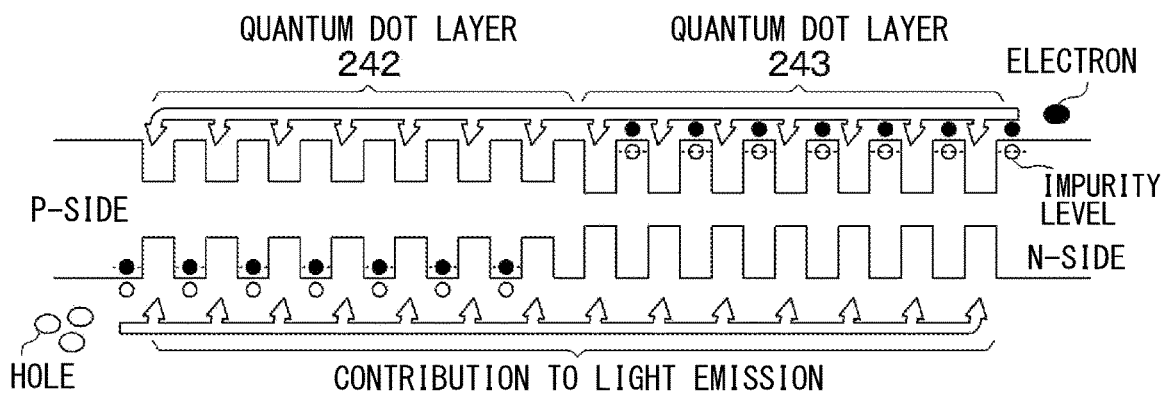
FIG. 7 is a band diagram of the first embodiment.

Effects achieved by the present embodiment will be described. It is assumed a case in which the quantum dot layer 243 is an undoped layer containing almost no p-type impurity and almost no n-type impurity. In this case, as shown in FIG. 6, highly mobile electrons diffuse from the underclad layer 23 into the entire active layer 24. On the other hand, the holes having low mobility diffuse in a region of the active layer 24 closer to the overclad layer 25. However, most of the holes recombine with the electrons uniformly diffused to the quantum dot layers 242. Further, the newly supplied holes move so as to supplement the holes disappeared in the quantum dot layers 242, and do not reach a region of the active layer 24 closer to the underclad layer 23. Therefore, in the quantum dot layers 243 closer to the underclad layer 23, bonding between electrons and holes do not occur, and thus such quantum dot layers 243 does not contribute to light emission.

On the other hand, in the present embodiment, the quantum dot layers 243 are doped with the n-type impurity at a high concentration. For this reason, the electron concentration of the quantum dot layers 243 is high. As the probability of recombination of electrons with holes increases, the holes are attracted, and the diffusion of holes is enhanced also in the quantum dot layers 243. Therefore, the quantum dot layers 243 in the vicinity of the underclad layer 23 also contribute to light emission. As a result, the gain of the active layer 24 as a whole improves.

As described above, in the present embodiment, the active layer 24 has a plurality of quantum dot layers, and the plurality of quantum dot layers include the quantum dot layer 242 doped with a p-type impurity and a quantum dot layer 243 doped with an n-type impurity and having a different emission wavelength from the quantum dot layer 242. As a result, the gain of the quantum dot layer 242 improves.

According to the embodiment described above, the following advantageous effects will be achieved.

(1) The quantum dot layer 242 is closer to the overclad layer 25 than the quantum dot layer 243. For this reason, the diffusion of carriers in the quantum dot layer 242 is promoted.

(2) The p-type impurity concentration of the plurality of quantum dot layers 242, 243 increases as the quantum dot layers 242, 243 are closer to the overclad layer 25. By increasing the concentration of the p-type impurity at the end of the active layer 24 in this way, the diffusion of carriers is further promoted, and the gain of the active layer 24 is further improved.

(3) The n-type impurity concentration of the plurality of quantum dot layers 242, 243 increases as the quantum dot layers 242 and 243 are closer to the underclad layer 23. By increasing the n-type impurity concentration at the end of the active layer 24 in this way, the diffusion of carriers is further promoted, and the gain of the active layer 24 is further improved.

(4) The emission wavelength of the quantum dot layer 242 is shorter than the emission wavelength of the quantum dot layer 243. As a result, it is possible to suppress a decrease in gain at the operating wavelength $\lambda op$, when the temperature is high.

Second Embodiment

A second embodiment will be described. The present embodiment is different from the first embodiment in the configuration of the active layer 24, and the other configurations are similar to the first embodiment, so only the difference from the first embodiment will be described.

Figure 8:
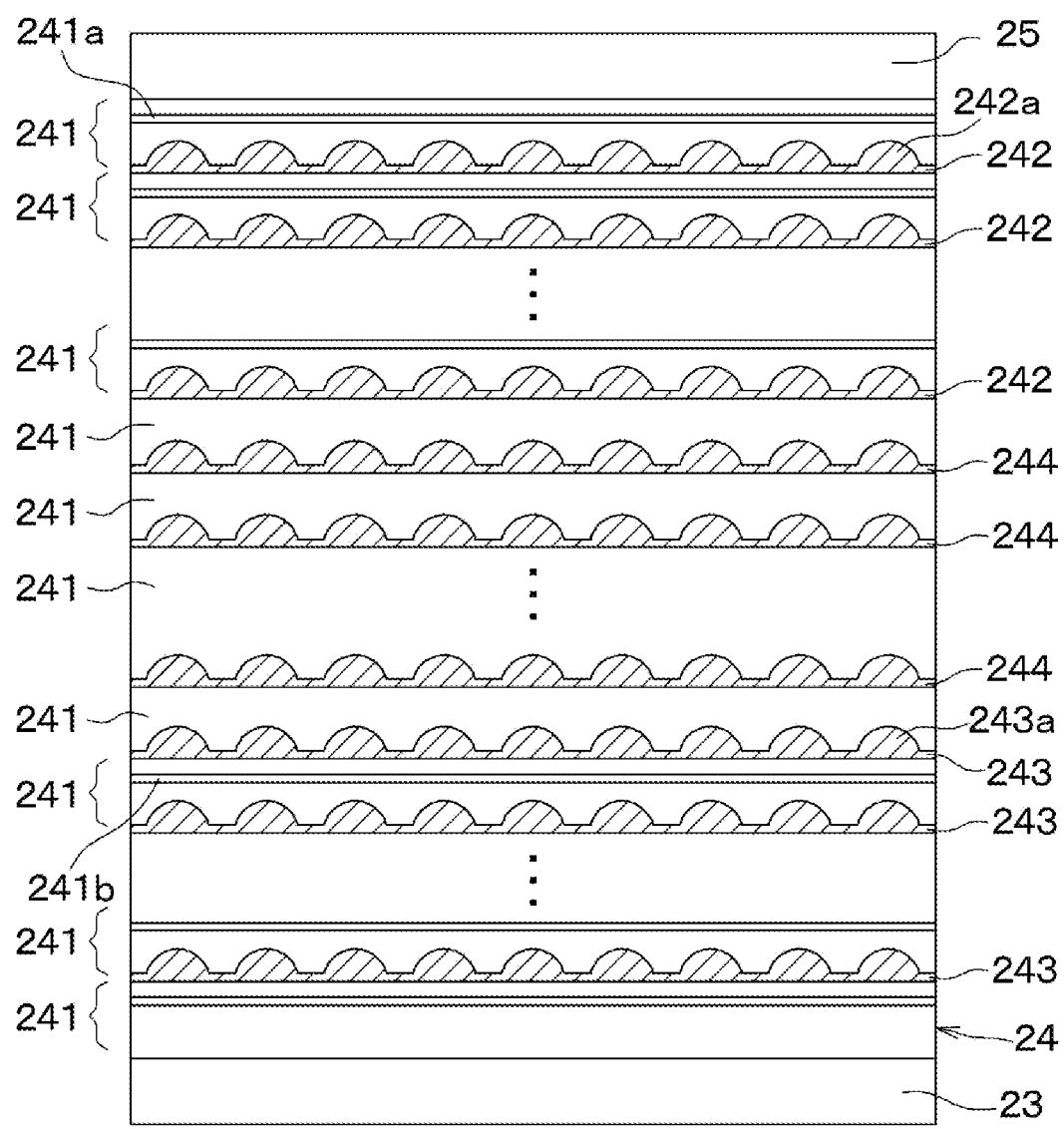
FIG. 8 is a cross-sectional view of an active layer according to a second embodiment.

As shown in FIG. 8, in the present embodiment, the active layer 24 includes a plurality of quantum dot layers 244, in addition to the quantum dot layers 242 and the quantum dot layers 243, as the plurality of quantum dot layers of the active layer 24. The quantum dot layer 244 corresponds to a third quantum dot layer.

The active layer 24 includes the plurality of quantum dot layers 244. The plurality of quantum dot layers 244 are disposed between the plurality of quantum dot layers 242 and the plurality of quantum dot layers 243. For example, the number of the quantum dot layers 242 is eight, the number of the quantum dot layers 243 is five, and the number of the quantum dot layers 244 is three.

The p-type impurity concentration and the n-type impurity concentration of the quantum dot layer 244 are lower than those of the quantum dot layer 242. Also, the p-type impurity concentration and the n-type impurity concentration of the quantum dot layer 244 are lower than those of the quantum dot layer 243.

Specifically, the intermediate layer 241 disposed between the two quantum dot layers 244 does not contain the p-type impurity layer 241a and the n-type impurity layer 241b. Further, the intermediate layer 241 disposed on the uppermost quantum dot layer 244 and the intermediate layer 241 disposed under the lowermost quantum dot layer 244 do not contain the p-type impurity layer 241a and the n-type impurity layer 241b. With such a configuration, the quantum dot layer 244 is an undoped layer containing almost no p-type impurity and almost no n-type impurity.

Figure 9:
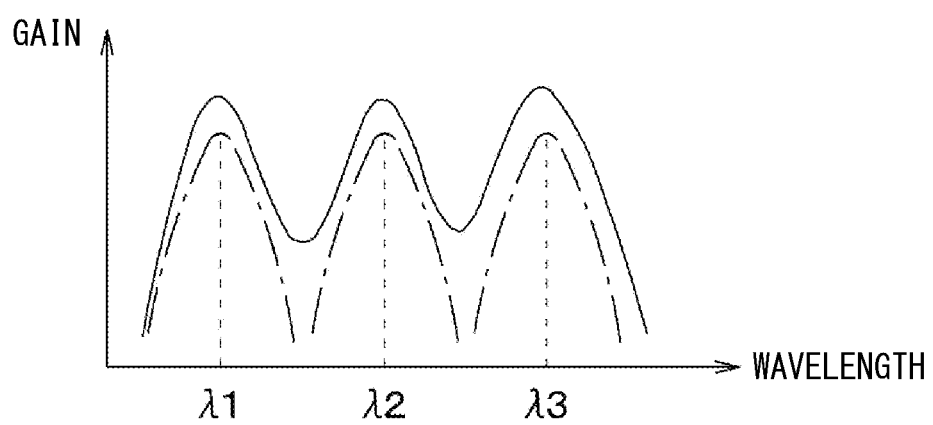
FIG. 9 is a diagram showing a gain spectrum of the active layer according to the second embodiment.

Assuming that the emission wavelength of the quantum dot layer 244 is referred to as $\lambda 3$, the wavelength $\lambda 2$ of the quantum dot layer 243 is smaller than the wavelength $\lambda 3$ of the quantum dot layer 244 ($\lambda 2 < \lambda 3$). As a result, the active layer 24 has the gain spectrum as shown in FIG. 9. In FIG. 9, the solid line shows the gain spectrum of the active layer 24. The alternate long and short dash line on the left shows the gain spectrum of the quantum dot layer 242, and the alternate long and short dash line on the right shows the gain spectrum of the quantum dot layer 244. The alternate long and short dash line in the middle shows the gain spectrum of the quantum dot layer 243. The undoped layer has a smaller gain decrease than the quantum dot layer doped with the p-type impurity or the n-type impurity, when the temperature is low. Therefore, by making the emission wavelength of the quantum dot layer 244 longer than that of the quantum dot layer 242 and the quantum dot layer 243, it is possible to suppress a decrease in gain at the operating wavelength $\lambda op$ when the temperature is low.

As described above, the plurality of quantum dot layers of the active layer 24 are configured such that the p-type impurity concentration increases as the emission wavelength decreases, and the p-type impurity concentration and the n-type impurity concentration decrease as the emission wavelength increases. As such, high gains can be obtained over a wide wavelength range.

Alternatively, the wavelengths are set as $\lambda 2 \approx \lambda 3$ or $\lambda 3 < \lambda 2$, and the gain spectrum composed of the wavelength $\lambda 2$ and the wavelength $\lambda 3$ is unimodal. In this case, the gain spectrum of the active layer 24 has the same shape as that of FIG. 4, and the gain spectrum shown by the alternate long and short dash line on the right side is composed of the gains of the quantum dot layer 243 and the quantum dot layer 244. Also in this case, it is possible to suppress a decrease in gain at the operating wavelength $\lambda op$, when the temperature is low.

In the present embodiment, it is possible to achieve the advantageous effects as similar to the effects in the first embodiment with the configuration and operation identical to the ones in the first embodiment.

According to the embodiment described above, it is possible to achieve the following advantageous effects.

(1) The active layer 24 includes the quantum dot layers 244, in addition to the quantum dot layers 242 and the quantum dot layers 243, as the plurality of quantum dot layers. The p-type impurity concentration and the n-type impurity concentration of the quantum dot layers 244 are lower than those of the quantum dot layers

242, as well as lower than those of the quantum dot layers 243. As a result, it is possible to suppress the decrease in gain when the temperature is low.

(2) The wavelength $\lambda 2$ of the quantum dot layer 243 is shorter than the wavelength $\lambda 3$ of the quantum dot layer 244 (i.e., $\lambda 2 < \lambda 3$). Alternatively, the gain spectrum of the active layer 24 composed of the wavelength $\lambda 2$ and the wavelength $\lambda 3$ is unimodal. In this case, it is possible to further suppress the decrease in gain when the temperature is low.

(3) In the plurality of quantum dot layers included in the active layer 24, the p-type impurity concentration increases as the wavelength decreases. With such a configuration, a high gain can be obtained in a wide wavelength range.

(4) In the plurality of quantum dot layers included in the active layer 24, the p-type impurity concentration and the n-type impurity concentration decrease as the wavelength increases. With such a configuration, a high gain can be obtained in a wide wavelength range.

Other Embodiments

The present disclosure is not limited to the embodiments described above, and can be appropriately modified within the scope described in the claims. In each of the embodiments described above, individual elements or features of a particular embodiment are not necessarily essential unless it is specifically stated that the elements or the features are essential, or unless the elements or the features are obviously essential in principle. Further, in each of the embodiments described above, when numerical values such as the number, quantity, range, and the like of the constituent elements of the embodiment are referred to, except in the case where the numerical values are expressly indispensable in particular, the case where the numerical values are obviously limited to a specific number in principle, and the like, the numerical values will not be limited to the specific number.

What is claimed is:

1. An optical semiconductor device comprising:
   an active layer having a plurality of quantum dot layers;
   a p-type clad layer stacked on one side of the active layer; and
   an n-type clad layer stacked on an opposite side of the active layer, wherein
   the plurality of quantum dot layers include:
   a plurality of first quantum dot layers doped with a p-type impurity; and
   a plurality of second quantum dot layers doped with an n-type impurity and having an emission wavelength different from that of the first quantum dot layers,
   the plurality of first quantum dot layers is disposed closer to the p-type clad layer than the plurality of second quantum dot layers,
   the plurality of second quantum dot layers is disposed closer to the n-type clad layer than the plurality of first quantum dot layers,
   the plurality of first quantum dot layers has a p-type impurity concentration that increases as the plurality of first quantum dot layers is closer to the p-type clad layer, and
   the plurality of second quantum dot layers has an n-type impurity concentration that increases as the plurality of second quantum dot layers is closer to the n-type clad layer.

2. The optical semiconductor device according to claim 1, wherein
   the plurality of first quantum dot layers has an emission wavelength shorter than that of the plurality of second quantum dot layers.

3. The optical semiconductor device according to claim 1, wherein
   the plurality of quantum dot layers includes a third quantum dot layer, in addition to the plurality of first quantum dot layers and the plurality of second quantum dot layers, and
   the third quantum dot layer has a p-type impurity concentration and an n-type impurity concentration both lower than those of the plurality of first quantum dot layers and the plurality of second quantum dot layers.

4. The optical semiconductor device according to claim 1, wherein
   the plurality of quantum dot layers includes a third quantum dot layer, in addition to the plurality of first quantum dot layers and the plurality of second quantum dot layers,
   the emission wavelength of the plurality of second quantum dot layers is referred to as $\lambda 2$, and an emission wavelength of the third quantum dot layer is referred to as $\lambda 3$, and
   the emission wavelength $\lambda 2$ is smaller than the emission wavelength $\lambda 3$.

5. The optical semiconductor device according to claim 1, wherein
   the plurality of quantum dot layers includes a third quantum dot layer, in addition to the plurality of first quantum dot layers and the plurality of second quantum dot layers,
   the emission wavelength of the plurality of second quantum dot layers is referred to as $\lambda 2$, and an emission wavelength of the third quantum dot layer is referred to as $\lambda 3$, and
   the emission wavelength $\lambda 2$ and the emission wavelength $\lambda 3$ form a unimodal gain spectrum in a gain spectrum of the active layer.

6. The optical semiconductor device according to claim 1, wherein
   the plurality of quantum dot layers have a higher p-type impurity concentration with a decrease in emission wavelength.

7. The optical semiconductor device according to claim 1, wherein
   the plurality of quantum dot layers have lower p-type impurity concentration and n-type impurity concentration with an increase in emission wavelength.

8. The optical semiconductor device according to claim 1, wherein
   each first quantum dot layer of the plurality of first quantum dot layers has a p-type impurity concentration of at least twice a surface density of quantum dots of the first quantum dot layer, and
   each second quantum dot layer of the plurality of second quantum dot layers has an n-type impurity concentration of at least twice a surface density of quantum dots of the second quantum dot layer.

9. An optical semiconductor device comprising:
   an active layer having a plurality of quantum dot layers; and
   a p-type clad layer stacked on the active layer, wherein
   the plurality of quantum dot layers includes:
   a plurality of first quantum dot layers doped with a p-type impurity; and a plurality of second quantum dot layers doped with an n-type impurity and having an emission wavelength different from that of the first quantum dot layer, the plurality of first quantum dot layers is disposed closer to the p-type clad layer than the plurality of second quantum dot layers, the plurality of first quantum dot layers has an emission wavelength shorter than that of the plurality of second quantum dot layers, the plurality of quantum dot layers further includes a plurality of third quantum dot layers between the plurality of first quantum dot layers and the plurality of second quantum dot layers, a p-type impurity concentration and an n-type impurity concentration of the plurality of third quantum dot layer are both lower than those of the plurality of first quantum dot layers and the plurality of second quantum dot layers, the emission wavelength of the plurality of second quantum dot layers is referred to as $\lambda 2$, and an emission wavelength of the plurality of third quantum dot layers is referred to as $\lambda 3$, and the emission wavelength $\lambda 2$ is smaller than the emission wavelength $\lambda 3$, or the emission wavelength $\lambda 2$ and the emission wavelength $\lambda 3$ form a unimodal gain spectrum in a gain spectrum of the active layer.

10. The optical semiconductor device according to claim 9, wherein
the plurality of first quantum dot layers has a p-type impurity concentration that increases as the plurality of first quantum dot layers are closer to the p-type clad layer.

11. The optical semiconductor device according to claim 9, wherein
the plurality of quantum dot layers has a higher p-type impurity concentration with a decrease in emission wavelength.

12. The optical semiconductor device according to claim 9, wherein
the plurality of quantum dot layers have lower p-type impurity concentration and n-type impurity concentration with an increase in emission wavelength.

13. The optical semiconductor device according to claim 9, wherein
the plurality of first quantum dot layers each has a p-type impurity concentration of at least twice a surface density of quantum dots of the first quantum dot layer, and
the plurality of second quantum dot layers has an n-type impurity concentration of at least twice a surface density of quantum dots of the second quantum dot layer.

14. The optical semiconductor device according to claim 9, further comprising:
an n-type clad layer stacked on the active layer on a side opposite to the p-type clad layer and closer to the plurality of second quantum dot layers.

15. The optical semiconductor device according to claim 1, wherein
the active layer has a plurality of intermediate layers disposed between adjacent quantum dot layers,
the intermediate layer disposed between adjacent first quantum dot layers includes a p-type impurity layer, and
the intermediate layer disposed between adjacent second quantum dot layers includes an n-type impurity layer.

16. The optical semiconductor device according to claim 15, wherein
a p-type impurity concentration of the p-type impurity layers increases as the p-type impurity layers are closer to the p-type clad layer, and
an n-type impurity concentration of the n-type impurity layers increases as the n-type impurity layers are closer to the n-type clad layer.

17. The optical semiconductor device according to claim 16, wherein
the intermediate layer is made of GaAs, and
the plurality of first quantum dot layers and the plurality of second quantum dot layers are made of GaAs or InGaAs.

* * * * *